United States Patent
Li et al.

(10) Patent No.: US 9,881,816 B2
(45) Date of Patent: Jan. 30, 2018

(54) CLEANING COMPOSITION AND METHOD FOR SEMICONDUCTOR DEVICE FABRICATION

(71) Applicant: TAIWAN SEMICONDUCTOR MANUFACTURING COMPANY, LTD., Hsin-Chu (TW)

(72) Inventors: Chia-Wen Li, Hsinchu (TW); Bo-Wei Chou, Hsinchu (TW); Shao-Yen Ku, Jhubei (TW); Chen Ming-Jung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 865 days.

(21) Appl. No.: 13/757,094

(22) Filed: Feb. 1, 2013

(65) Prior Publication Data

US 2014/0216499 A1     Aug. 7, 2014

(51) Int. Cl.
| | |
|---|---|
| *C23G 1/02* | (2006.01) |
| *H01L 21/67* | (2006.01) |
| *C11D 11/00* | (2006.01) |
| *H01L 21/02* | (2006.01) |
| *C11D 7/06* | (2006.01) |
| *C11D 7/08* | (2006.01) |

(52) U.S. Cl.
CPC ......... *H01L 21/67051* (2013.01); *C11D 7/06* (2013.01); *C11D 7/08* (2013.01); *C11D 11/0047* (2013.01); *H01L 21/02057* (2013.01)

(58) Field of Classification Search
None
See application file for complete search history.

(56) References Cited

U.S. PATENT DOCUMENTS

| | | | |
|---|---|---|---|
| 5,656,097 A * | 8/1997 | Olesen ...................... | B08B 3/12 134/1 |
| 5,972,123 A | 10/1999 | Verhaverbeke | |
| 5,983,909 A | 11/1999 | Yeol | |
| 7,235,516 B2 | 6/2007 | Morinaga et al. | |
| 2005/0072446 A1* | 4/2005 | Bergman ................... | B08B 3/02 134/2 |
| 2005/0130420 A1* | 6/2005 | Huang ............... | H01L 21/32138 438/689 |

(Continued)

FOREIGN PATENT DOCUMENTS

| | | |
|---|---|---|
| KR | 20060115968 A | 11/2006 |
| KR | 20060115968 (A) | 11/2006 |

OTHER PUBLICATIONS

Vos, R., et al. "Use of Surfactants for Improved Particle Performance of dHF-Based Cleaning Recipes" Solid State Phenomena, vols. 76-77, 2001, pp. 263-266, Trans Tech Publications, Switzerland, only one page on record.

(Continued)

*Primary Examiner* — Eric Golightly
(74) *Attorney, Agent, or Firm* — Haynes and Boone, LLP

(57) ABSTRACT

A method of cleaning a substrate such as semiconductor substrate for IC fabrication is described that includes cleaning the semiconductor substrate with a mixture of ozone and one of an acid and a base. Exemplary acids and bases include HCl, HF, and $NH_4OH$. The cleaning mixture may further include de-ionized water. In an embodiment, the mixture is sprayed onto a heated substrate surface.

11 Claims, 4 Drawing Sheets

(56) References Cited

U.S. PATENT DOCUMENTS

| | | |
|---|---|---|
| 2006/0011214 A1 | 1/2006 | Liu et al. |
| 2006/0234503 A1 | 10/2006 | Yamada et al. |
| 2009/0275213 A1 | 11/2009 | Gotou et al. |
| 2011/0263133 A1* | 10/2011 | Hara ................. H01L 21/67028 438/758 |
| 2014/0216499 A1 | 8/2014 | Li et al. |
| 2015/0000704 A1* | 1/2015 | Yeh .......................... C11D 7/06 134/19 |

OTHER PUBLICATIONS

Lee, Gun-Ho et al "Particle Removal on Silicon Wafer Surface by Ozone-HF—NH4OH Sequence", Korean Chem. Eng. Res., vol. 45, No. 2, Apr. 2007, pp. 203-207, English abstract.

* cited by examiner

CLEANING COMPOSITION AND METHOD FOR SEMICONDUCTOR DEVICE FABRICATION

BACKGROUND

The semiconductor integrated circuit (IC) industry has experienced rapid growth. Technological advances in IC materials and design have produced generation after generation with smaller and more complex circuits. During the course of this evolution, functional density has increased, while geometry size has decreased. This scaling down generally has led to production efficiencies and lowered costs. However, such scaling also increased processing and fabrication complexities. These complexities can have their own associated costs.

For example, as technology nodes decrease, one rising cost is the requirement of extensive volumes of chemicals used to support the manufacturing process and its complexity. The increase in chemical volume over time has associated costs of not only the acquisition of the chemical itself, but also in environmental impact. One process demanding great volumes of chemical is the wafer cleaning process. Wafer cleaning processes are performed through-out the fabrication process of an IC. Exemplary conventional cleaning processes are "standard clean 1" and "standard clean 2" also referred to as SC1 and SC2. The cleaning processes are typically used to remove particles (e.g., SC1) and/or metal ions (e.g., SC2). Although these existing cleaning processes have been generally satisfactory for specific purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
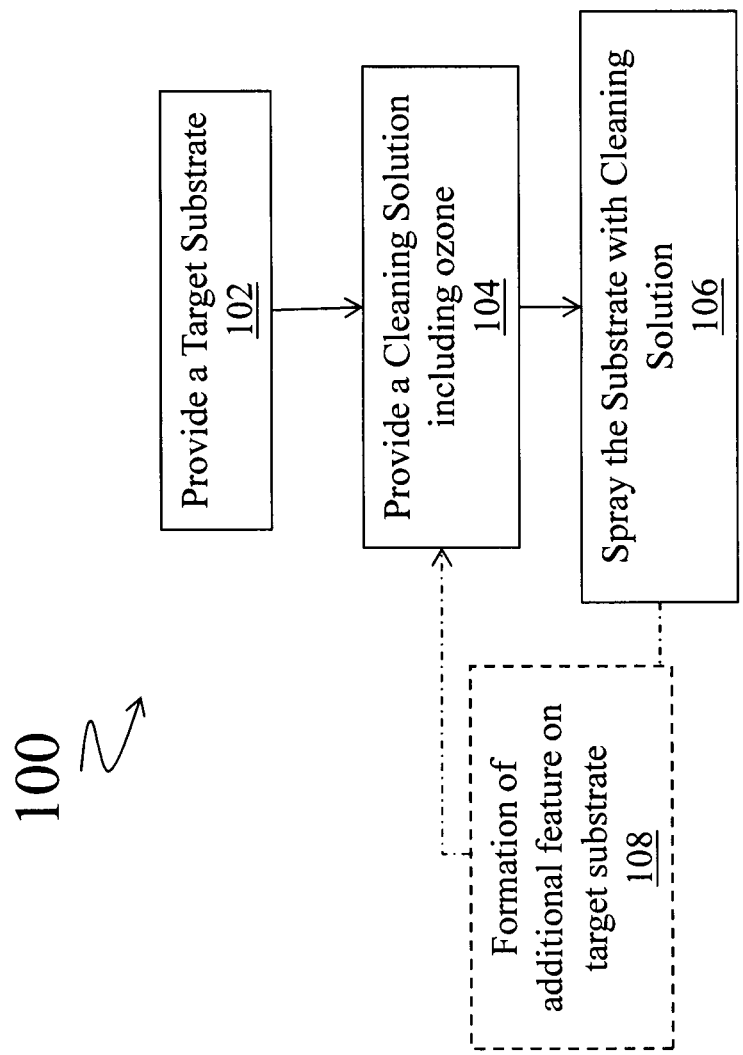
FIG. 1 is a flow chart illustrating an embodiment of a method of cleaning a semiconductor substrate according to one or more aspects of the present disclosure.

Illustrated in FIG. 1 is a method 100 of cleaning a substrate. It is understood that additional steps may be provided before, during and/or after the method 100. The method 100 begins at block 102 where a semiconductor substrate is provided.

In an embodiment, the substrate is a wafer. The substrate may have devices or portions thereof formed thereon, such as, for example, integrated circuits, light emitting diodes (LEDs), TFT-LCDs, memory cells and/or logic circuits. The substrate may further include passive components such as resistors, capacitors, inducers, fuses and/or active devices such as p-channel field effect transistors (PFETs), n-channel transistors (NFETs), metal-oxide-semiconductor field effect transistors (MOSFETs), complementary metal-oxide-semiconductor transistors (CMOSs), high voltage transistors, high frequency transistors, and/or other suitable components or portions thereof. One or more of the components may be partially fabricated (e.g., in process).

The substrate may be a semiconductor substrate that includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate may be strained, may be a semiconductor on insulator (SOI), have an epitaxial layer, and/or have other features enhancing performance. In other embodiments, the method 100 may be performed to clean a substrate that includes a non-semiconductor material, such as a glass substrate for thin-film-transistor liquid crystal display (TFT-LCD) devices, or fused quartz or calcium fluoride for a photomask (mask).

The substrate may comprise one or more material layers forming one or more features on the substrate. Exemplary materials that form the features include high-k dielectric layers, gate layers, hard mask layers, interfacial layers, capping layers, diffusion/barrier layers, dielectric layers, conductive layers, other suitable layers, and/or combinations thereof. In an embodiment, the method 100 is performed on a substrate having a gate feature formed on the surface (e.g., target surface to be cleaned). Other exemplary features include, but are not limited to, interconnect features (e.g., conductive lines and vias), contact features, source/drain features, conductive plate features, doped regions, isolation features, LED elements and portions thereof, trench features, dummy features, etc.

The method 100 then proceeds to block 104 where a cleaning solution is provided. It is noted that the term "solution" as referred to herein does not necessitate a homogeneous mixture of any components, but rather simply a liquid and/or a gas providing having one or more chemical components mixed. The cleaning solution provided includes ozone. The cleaning solution further includes de-ionized water (DIW). The cleaning solution may also further include at least one of an acid or a base. In an embodiment, the cleaning solution includes ozone, DIW, and an acid or a base. Exemplary acids that may be included in the cleaning solution include hydrochloric acid (HCl) and hydrofluoric acid (HF). Exemplary bases that may be included in the cleaning solution include ammonium hydroxide ($NH_4OH$). In an embodiment, the cleaning solution includes only ozone, DIW, and one of an acid or a base. For example, the solution does not include hydrogen peroxide ($H_2O_2$). Thus, an exemplary composition of the cleaning solution includes $O_3$ and HF. Another exemplary composition of the cleaning solution includes $O_3$ and $NH_4OH$. Yet another exemplary composition of the cleaning solution includes $O_3$ and HCl. One or more of these exemplary compositions may further include DIW.

In an embodiment, the cleaning solution includes at least one part acid to one part ozone. In a further embodiment, the cleaning solution includes one part acid to one part ozone and greater than or equal to approximately 40 parts DIW. In a further embodiment, the cleaning solution includes one part acid to one part ozone and approximately 50 parts DIW. In an embodiment, the cleaning solution includes at least one part base to approximately eight (8) parts ozone. In a further embodiment, the cleaning solution includes one part base to approximately 8 parts ozone and approximately 60 parts DIW.

The method 100 then proceeds to block 106 where the cleaning solution is provided onto a surface of the substrate. The cleaning solution may be sprayed onto a surface of the target substrate. The cleaning solution may be sprayed onto the semiconductor substrate using a single-wafer spray tool.

In an embodiment, the target substrate is heated before and/or during the cleaning solution being incident the surface of the semiconductor wafer. In an embodiment, the substrate is heated to between approximately 30 degrees Celsius (C.) and approximately 60 degrees C. In a further embodiment, the substrate is heated to approximately 40 degrees C. Heating the substrate may provide benefits such as increasing the solubility of ozone such as in DIW, acid or base; improving cleaning efficiency; reducing the amount of ozone lost; increasing impurity removal rate (e.g., $NH_4OH$); and/or other benefits now know or later appreciated.

The following process parameters are provided by way of example and are not intended to be limiting. In an embodiment, the chemical solution spray may be incident the substrate for approximately 20 to approximately 80 seconds. In a further embodiment, the chemical solution spray may be incident the substrate for approximately 30 to approximately 55 seconds, by way of example. The substrate may spin as the chemical solution is provided to its surface. In an embodiment, the substrate may rotate at approximately 800 rpm, by way of example.

After introduction of the cleaning solution, the block 106 may continue to provide a de-ionized water (DIW) rinse process. The rinse process may be between approximately 1 minute and approximately 2 minutes, by way of example. Block 106 may continue to include a dry process such as spin-dry process. Alternatively, the block 106 may include a plurality of processes having a cleaning solution such as discussed above provided to the target substrate, for example, the cleaning solutions having differing compositions (e.g., acid/ozone, base/ozone), as described below.

During the semiconductor device fabrication process, the cleaning performed by the cleaning solution of block 106 may be repeated any number of times as illustrated by the dashed line returning to block 104. In an embodiment, the cleaning process of block 106 is repeated in successive processes (e.g., without an interposing process), but with use of different chemical solutions. For example, block 106 may be performed first with a base (e.g., $NH_4OH$) and ozone, followed by a chemical solution clean of an acid (e.g., HCl) with ozone. As another example, block 106 may be performed first with an acid (e.g., HCl) and ozone, followed by a chemical solution clean of a base (e.g., $NH_4OH$) with ozone. In embodiments, processes may interpose the cleaning processes (such as, for example, rinse process(es), dry process(es), additional fabrication processes that form one or more features on the surface of the substrate such as the surface of substrate 404, described below with reference to FIG. 4) as illustrated by optional block 108. In other embodiments, the cleaning processes may be performed serially without interposing processes thereby omitting block 108.

The cleaning solution incident the surface of the semiconductor substrate may provide for etching/removing undesired material from the semiconductor substrate. For example, in an embodiment the cleaning solution includes HF which may remove a portion of an oxide such as $SiO_2$ on the target substrate. The cleaning solution incident the surface of the semiconductor substrate may provide for cleaning metallic particulates from the semiconductor substrate. For example, in an embodiment the cleaning solution includes HCl with ozone to remove and/or clean metals (e.g., unwanted metal ions). The cleaning solution incident the surface of the semiconductor substrate may provide for removing unwanted particulates from the semiconductor substrate. For example, in an embodiment the cleaning solution includes $NH_4OH$ with ozone to remove particulates. In one or more embodiments, the ozone may serve as a substrate surface oxidant useful in the cleaning process(es).

Figure 2:
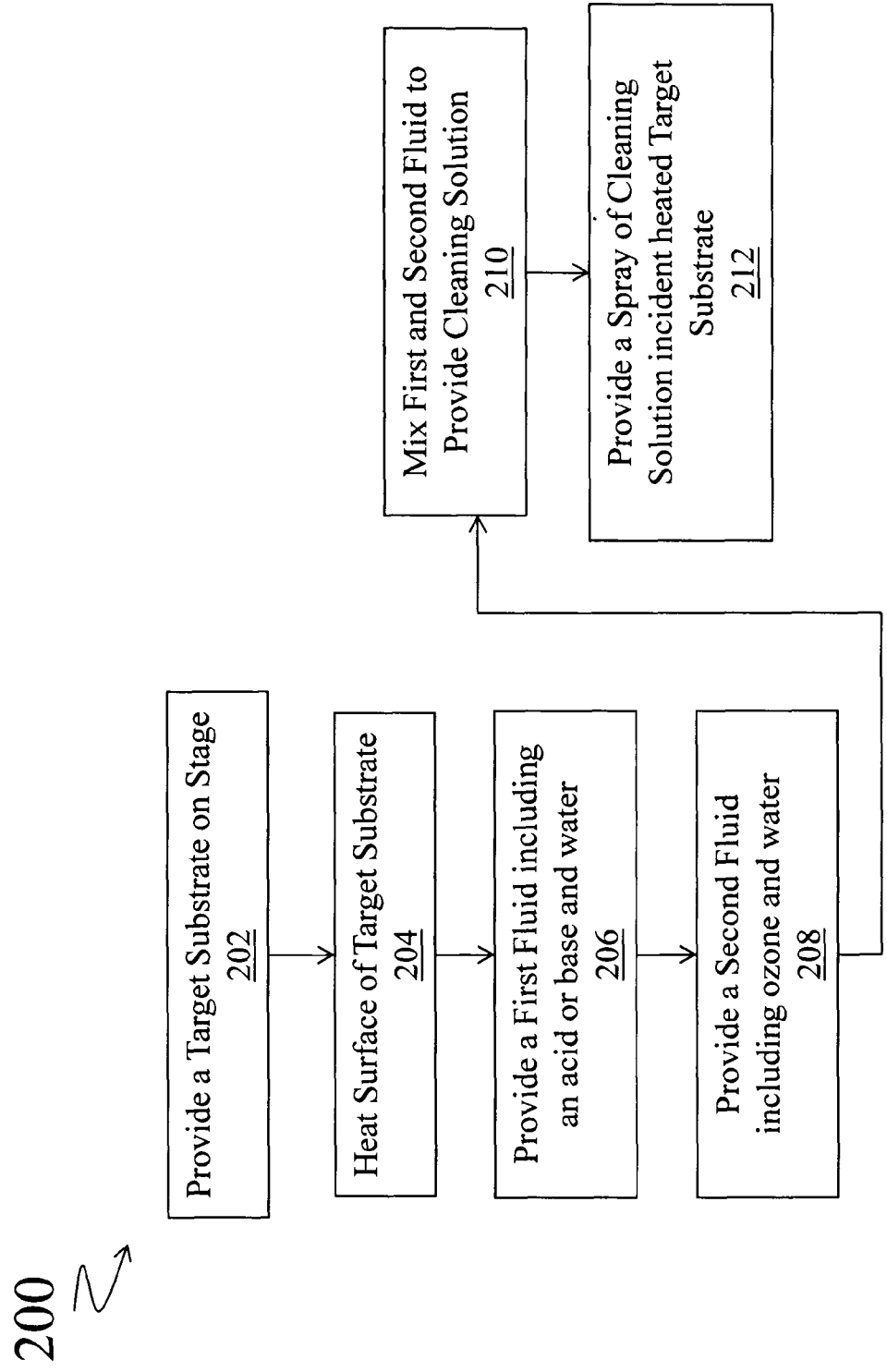
FIG. 2 is a flow chart illustrating an embodiment of the method of cleaning the semiconductor substrate according to the method of FIG. 1.

Referring now to the flow chart of FIG. 2, illustrated is a method 200 of cleaning a target substrate such as a semiconductor substrate or wafer. The method 200 may be an embodiment of the method 100, discussed above. As such, the descriptions of the method 100 are likewise applicable to the method 200. The method 200 provides further detail as to a method of operating an apparatus to introduce the cleaning solution to the target substrate.

The method 200 begins at block 202 where a substrate is provided. The substrate may be substantially similar to the substrate discussed above with reference to block 102 of the method 100 of FIG. 1. The substrate is placed on a stage (e.g., chuck or base) operable to hold and/or position a substrate such as a semiconductor wafer. In an embodiment, the stage is operable to rotate the substrate. In an embodiment, the stage is operable to heat the substrate (or surface thereof). Referring to the example of FIG. 4, a cleaning apparatus 400 is illustrated and includes a stage 402. The stage 402 holds a substrate—a wafer 404. The wafer 404 may include a feature a gate feature formed on the surface. Other exemplary features include, but are not limited to, interconnect features (e.g., conductive lines and vias), contact features, source/drain features, conductive plate features, doped regions, isolation features, LED elements and portions thereof, trench features, dummy features, etc.

The method 200 then proceeds to block 204 where a surface of the target substrate is heated. The stage may provide the heating of the target substrate. The heating may increase the temperature of the surface of the target substrate targeting for cleaning.

In an embodiment, the target substrate surface is heated concurrently with the cleaning solution being incident the surface. In an embodiment, the target substrate is heated to between approximately 30 degrees Celsius (C.) and approximately 60 degrees C. In a further embodiment, the target substrate is heated to approximately 40 degrees Celsius (C.). Heating the substrate surface having the incident cleaning solution may provide benefits such as increasing the solubility of ozone such as in DIW, acid or base; improving cleaning efficiency; reducing the amount of ozone lost; increasing impurity removal rate (e.g., $NH_4OH$); and/or other benefits now know or later appreciated. In an embodiment, block 204 is omitted. Referring to the example of FIG. 4, heat energy 414 is illustrated as being provided by the stage 402 to the wafer 404.

The method 200 then proceeds to block 206 where a first fluid including an acid, base, and/or DIW is provided. For example, the first fluid (e.g., liquid or gaseous) may include one of an acid or base in mixture with DIW. Exemplary acids that may be included in the first fluid include hydrochloric acid (HCl) and hydrofluoric acid (HF). Exemplary bases that may be included in the first fluid include ammonium hydroxide ($NH_4OH$). In an embodiment, the first fluid does not include hydrogen peroxide ($H_2O_2$). Thus, an exemplary composition of the first fluid is HF and DIW. Another exemplary composition of the first fluid is DIW and $NH_4OH$. Yet another exemplary composition of the first fluid includes DIW and HCl.

Figure 3:
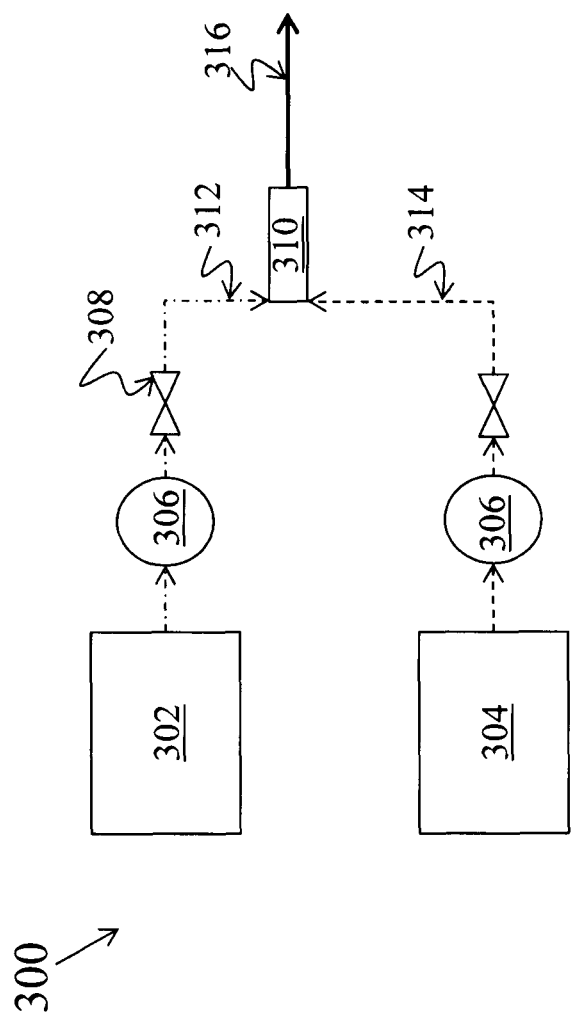
FIG. 3 is a schematic of an embodiment of an apparatus to provide a cleaning solution according to one or more aspects of the present disclosure.

The first fluid may be kept in a reservoir and provided to a cleaning apparatus using devices such as tubing or pipes having pumps, valves, and the like. FIG. 3 provides an exemplary embodiment of a fluid delivery system 300 having a first reservoir 302. In an embodiment, the first reservoir includes DIW and an acid or base. In an embodiment, the first reservoir 302 holds HF and DIW; DIW and HCl; or DIW and $NH_4OH$. The fluid of the first reservoir may be removed from the reservoir by a pump 306. The flow rate of the fluid expelled from the first reservoir may be controlled by a valve 308. In FIG. 3 a first fluid 312 is illustrated. The first fluid 312 may be held in a device such as a tube, pipe, or other apparatus for transporting flowing fluid between the illustrated elements.

Figure 4:
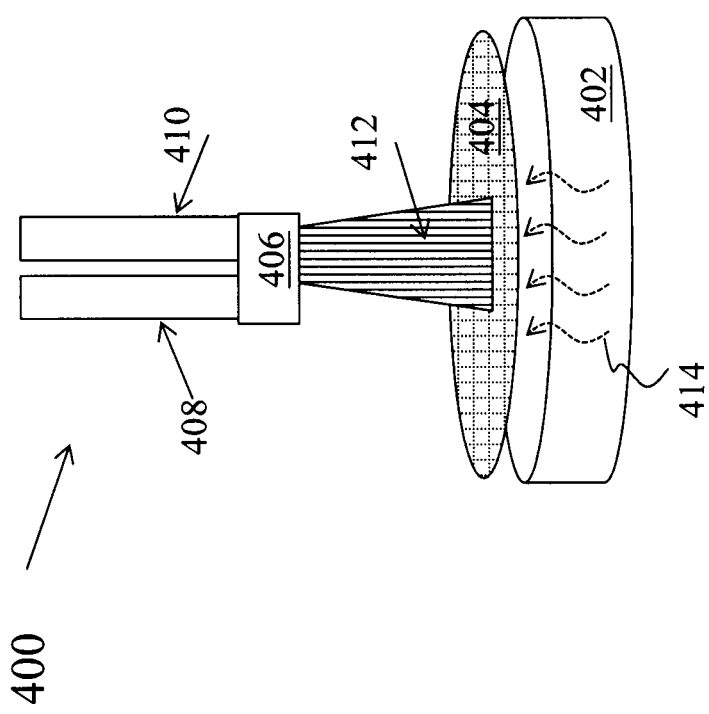
FIG. 4 is a perspective view of an embodiment of an apparatus to provide a cleaning solution to a target semiconductor substrate according to one or more aspects of the present disclosure.

FIG. 4 illustrates a cleaning apparatus 400 that includes a device 408 that is operable to provide a fluid such as the first fluid 312. In an embodiment, the device 408 is operably coupled to and/or includes a reservoir, pumps, and/or valves such as described in FIG. 3. In an embodiment, the device 408 is a tube, pipe or other apparatus operable to transport a flowing fluid. In an embodiment, the first device 408 includes a first fluid such as described with respect to block 206. Thus, in an embodiment, the first device 408 holds and/or delivers HF and DIW; DIW and HCl; or DIW and $NH_4OH$ in the chemical cleaning apparatus 400.

The method 200 then proceeds to block 208 where a second fluid including ozone and DIW is provided. The ozone may be dissolved in DIW (e.g., liquid DIW). The second fluid may be provided at a temperature lower than room temperature. For example, in an embodiment, the second fluid (e.g., ozone) is provided between approximately 15 C and approximately 20 C. It is noted that dissolution of ozone in DIW is based on the temperature and/or pH value of the fluid (e.g., a lower temperature provides for greater dissolution of ozone, an acidic condition provides for greater dissolution of ozone). Thus, the pH and/or temperature of the water and ozone mixture may be controlled to provide adequate ozone solubility. In an embodiment, there are between approximately 5 and 25 ppm of ozone in the DIW.

The second fluid may be kept in a reservoir and provided to a cleaning apparatus using a device such as tubing or pipes having pumps, valves, and the like. FIG. 3 provides an exemplary embodiment of the fluid delivery system 300 having a second reservoir 304. In an embodiment, the second reservoir includes DIW and ozone. The second reservoir 304 may be operable to provide the second fluid at less than room temperature as described above. The fluid of the second reservoir may be removed from the reservoir by the pump 306. The flow rate of the fluid of the second reservoir may be controlled by the valve 308. Second fluid 314 (e.g., ozone and DIW) is illustrated being transported from the reservoir 304. The second fluid 314 in transport may be held in a device such as a tube, pipe, or other apparatus for transporting flowing fluid.

FIG. 4 illustrates the chemical cleaning apparatus 400 that includes a device 410 that is operable to provide a fluid such as the second fluid 314, described above. In an embodiment, the device 410 includes or is operably coupled to a reservoir, pumps, and/or valves such as described in FIG. 3. In an embodiment, the device 410 includes a tube, pipe or other apparatus operable to transport a flowing fluid. In an embodiment, the second device 410 transports and provides a second fluid such as described with respect to block 208. Thus, in an embodiment, the second device 410 holds and/or delivers DIW and ozone in the cleaning apparatus 400. The second device 410 may be operable to provide a fluid at a reduced (e.g., lower than room temperature) temperature.

The method 200 then proceeds to block 210 where the first and second fluids are mixed to provide a cleaning solution. In an embodiment, the first and second fluids are mixed in a mixing chamber. In an embodiment, the first and second fluids are mixed after they are dispersed but prior to being incident the target substrate. In an embodiment, the first and second fluid are mixed in a short mixing loop or cycle such that the mixed fluids do not "sit" after combination but are immediately provided to a target substrate such as described below with reference to block 212. The short mixing loop may provide advantages such as prevention and/or reduction of ozone decay in the acid/base, for example, decay in $NH_4OH$.

FIG. 3 illustrates an embodiment of a mixing chamber 310. In an embodiment, the mixing chamber 310 is a pipe or tubing coupled to the device carrying the first fluid 312 and the second fluid 314. In an embodiment, the first fluid 311 is provided in a first tube/pipe and the second fluid 314 is provided in a second tube/pipe; these tubes/pipes are joined to form a single tube/pipe illustrated as chamber 310. In an embodiment, the fluid flows through the mixing chamber 310 at a given flowrate (e.g., fluid is not stationary within the chamber). A cleaning solution 316, a mixture of the first fluid 312 and the second fluid 314, is expelled from the mixing chamber 310. The cleaning solution 316 may be substantially similar to the cleaning solution described above with reference to block 104 of the method 100 of FIG. 1.

FIG. 4 illustrates an embodiment of a mixing chamber 406. In an embodiment, the mixing chamber 406 is a pipe or tubing coupled to the device 408 and the device 410. In an embodiment, the first device 408 is a first tube/pipe and the second device 410 is a second tube/pipe; these tubes/pipes are joined to form a single tube/pipe illustrated as chamber 406. In an embodiment, fluid flows through the mixing chamber 406 at a given flowrate (e.g., fluid is not stationary within the chamber) and is expelled from the mixing chamber 406 through a spray nozzle. The dispensed cleaning solution 412 is a mixture of the fluid of the first device 408 and the second device 410. The cleaning solution 412 may be substantially similar to the cleaning solution described above with reference to block 104 of the method 100 of FIG. 1.

The first and second fluids of blocks 206 and 208 may be mixed in a predetermined ratio to produce the cleaning solution. In an embodiment, the cleaning solution includes at least one part acid to one part ozone. In an embodiment, the cleaning solution includes one part acid to one part ozone and greater than 40 parts DIW. In a further embodiment, the cleaning solution includes one part acid to one part ozone and approximately 50 parts DIW. In an embodiment, the cleaning solution includes at least one part base to approximately eight (8) parts ozone. In a further embodiment, the cleaning solution includes one part base to approximately 8 parts ozone and approximately 60 parts DIW. Valves such as valves 308 of FIG. 3 may control the amount and/or flowrate of the first fluid 312 and the second fluid 314 to the mixing chamber 310, and thus, the composition of the cleaning solution. For example, FIG. 3 illustrates the cleaning solution 316, a mixture of the first fluid 312 and the second fluid 314, is dispensed from the mixing chamber 310. The amount of the first fluid 312 and the second fluid 314 may be controlled by valves 308.

The method 200 then proceeds to block 212 where the cleaning solution is sprayed onto the target substrate. The cleaning solution may be sprayed onto the substrate using a single-wafer spray tool. Referring to the example of FIG. 4, the cleaning solution 412 is incident the wafer 404. Any number of nozzles may provide the cleaning solution 412.

The following process parameters are provided by way of example and are not intended to be limiting. In an embodiment, the chemical solution spray 412 may be incident the target substrate 404 for a time between approximately 20 second and approximately 80 seconds, by way of example. In a further embodiment, the chemical solution spray 412 may be incident the target substrate 404 for approximately 30 seconds to approximately 55 seconds. The target substrate 404 may spin as the chemical solution is provided to its surface. In an embodiment, the substrate 404 may rotate, for example, at approximately 800 rpm, during the spray.

The method 200 may proceed to other processes such as additional cleaning processes, DIW rinse processes, dry processes, and the like. In an embodiment, the method 200 provides a first cleaning using a first cleaning solution of HF and DIW and ozone, followed by a second cleaning using a second cleaning solution of $NH_4OH$, DIW and ozone, followed by third cleaning process using a third cleaning solution of HCl, DIW and ozone. However, other embodiments are possible and other sequences are possible and within the scope of the present disclosure.

In summary, the methods and devices disclosed herein provide for a cleaning solution, cleaning method and apparatus for cleaning a target substrate such as a semiconductor substrate or wafer. In doing so, embodiments of the present disclosure may offer advantages over prior art methods. Exemplary advantages include savings of cost and/or reduction of environmental impact of use of chemicals in semiconductor device fabrication processes. For example, conventional cleans often use $H_2O_2$ as a component of the cleaning chemical as an oxidant for particle removal, metal ion removal, and/or surface oxidation. The use of $H_2O_2$ can lead to un-reacted chemicals in the process being wasted; thus, providing an environmental and monetary cost. In an embodiment, the cleaning solution of the present disclosure provides for the omission of $H_2O_2$. It is understood that different embodiments disclosed herein offer different disclosure, and that they may make various changes, substitutions and alterations herein without departing from the spirit and scope of the present disclosure.

Thus, the present disclosure provides numerous exemplary embodiments. In an embodiment, a method is described that provides a semiconductor substrate. The method continues to include cleaning the semiconductor substrate with a mixture of ozone and at least one of an acid and a base.

In a further embodiment, the ozone is dissolved in water and provided at less than or equal to approximately 20 degrees. The cleaning may further include heating the semiconductor substrate while the ozone and the at least one of the acid and base is incident the semiconductor substrate. In embodiments, the method may continue to include rinsing the semiconductor substrate with de-ionized wafer after the cleaning.

In a further embodiment, the mixture of ozone and at least one of an acid and a base includes a base ($NH_4OH$). In another embodiment, the mixture includes an acid (HCl). In yet another embodiment, the mixture includes an acid (HF). In an embodiment, the mixture of ozone and the at least one of an acid and a base includes at least one part of ozone for every part of the at least one acid and base. In a further embodiment, the mixture of ozone and the at least one of an acid and a base further includes at least 40 parts of de-ionized water for every part of the at least one acid and base.

In another of the broader forms of an embodiment of the present disclosure, a method of cleaning a semiconductor substrate is provided. The method includes providing a first device operable to hold a fluid. A first mixture of ozone and water is delivered to the first device. A second device operable to hold a fluid is also provided. A second mixture of water and at least one of an acid and a base is delivered to the second device. The first mixture is expelled from the first device and the second mixture is expelled from the second device. The expelled first and second mixtures to form a cleaning solution. The cleaning solution is provided onto a surface of the semiconductor substrate.

In a further embodiment of the method above, a stage is provided for the semiconductor substrate; the stage is operable to heat the semiconductor substrate. In an embodiment, the semiconductor substrate is heated to between approximately 20 and 60 degrees Celsius. The stage may also rotate the semiconductor substrate while the cleaning solution is provided to the surface of the semiconductor substrate.

The first device (holding the first mixture) may be a first tube and the second device may be a second tube. The first and second tubes may be joined to form a single tube, within which the mixing the first and second mixtures is performed. Mixing the first and second mixtures to form the cleaning solution may be performed substantially coincident with spraying the chemical solution to provide the cleaning solution to the surface of the semiconductor substrate.

In yet another embodiment, a method of fabricating a semiconductor device is provided that includes forming a first feature on a surface of a semiconductor wafer. A first cleaning mixture is sprayed onto the first feature on the surface—the first cleaning mixture includes ozone and an acid. After stopping the spraying of the first cleaning mixture, spraying a second cleaning mixture onto the second feature on the surface—the second cleaning mixture includes ozone and $NH_4OH$. In an embodiment, the acid of the first cleaning mixture is HCl.

In a further embodiment, after spraying the second cleaning mixture, the method proceeds to include rinsing and drying the semiconductor wafer. The spraying processes may include spraying only a single wafer at a given time. In an embodiment, after spraying the first cleaning mixture, the method includes rinsing and drying the semiconductor wafer and forming a second feature on the surface of the wafer prior to spraying the second cleaning mixture.

What is claimed is:

1. A method, comprising:
providing a semiconductor substrate;
providing a first device operable to hold a fluid;
delivering, to the first device, a first mixture, wherein the first device cools the first mixture to a first temperature lower than a room temperature, the first mixture including de-ionized water (DIW) and ozone;
providing a second device operable to hold a fluid;
delivering a second mixture including at least one of an acid and a base to the second device;
expelling the first mixture from the first device and the second mixture from the second device toward a first surface of the semiconductor substrate;
after the expelling the first and second mixtures and prior to either the first mixture or the second mixture being incident on the first surface of the semiconductor substrate, mixing the expelled first and second mixtures to form a cleaning solution, wherein the cleaning solution is free of hydrogen peroxide ($H_2O_2$); and
immediately after the mixing, cleaning the semiconductor substrate with the cleaning solution free of hydrogen peroxide ($H_2O_2$) by providing the cleaning solution free of hydrogen peroxide ($H_2O_2$) onto the first surface of the semiconductor substrate.

2. The method of claim 1, wherein the cleaning further includes heating the semiconductor substrate while the cleaning solution is incident the semiconductor substrate.

3. The method of claim 1, wherein the at least one of the acid and the base is $NH_4OH$.

4. The method of claim 1, further comprising:
rinsing the semiconductor substrate with de-ionized water after the cleaning.

5. The method of claim 1, wherein the cleaning solution includes at least one part of ozone for every part of the at least one of the acid and the base.

6. A method of cleaning a semiconductor substrate having a semiconductor device formed thereon, comprising:
providing a first device operable to hold a fluid;
delivering a first mixture of de-ionized water (DIW) and ozone to the first device, wherein the first device cools the first mixture from a first temperature to a second temperature, wherein the second temperature is determined based on a first predetermined ozone solubility in the DIW;
providing a second device operable to hold a fluid;
delivering a second mixture of DIW and at least one of an acid and a base to the second device;
expelling the first mixture from the first device and the second mixture from the second device toward a first surface of the semiconductor substrate;
after the expelling the first and second mixtures and prior to either the first mixture or the second mixture being incident on the first surface of the semiconductor substrate, mixing the expelled first and second mixtures to form a cleaning solution free of hydrogen peroxide ($H_2O_2$);
immediately after the mixing, providing the cleaning solution onto the first surface of the semiconductor substrate; and
while providing the cleaning solution free of hydrogen peroxide ($H_2O_2$) onto the first surface, providing heat to a second surface of the semiconductor substrate opposing the first surface so that the first surface of the semiconductor substrate has a third temperature higher than the first temperature,
wherein the third temperature is determined based on a second predetermined ozone solubility in the DIW different from the first predetermined ozone solubility in the DIW.

7. The method of claim 6, further comprising:
providing a stage for the semiconductor substrate, wherein the stage is operable to provide heat to the second surface of the semiconductor substrate.

8. The method of claim 7, wherein the stage rotates the semiconductor substrate while the cleaning solution is provided to the first surface of the semiconductor substrate.

9. The method of claim 7, wherein the semiconductor substrate is heated to between approximately 30 and 60 degrees Celsius.

10. The method of claim 6, wherein the mixing the first and second mixture to form the cleaning solution is performed substantially coincident with spraying the cleaning solution to provide the cleaning solution to the first surface of the semiconductor substrate.

11. The method of claim 6, wherein the at least one of the acid and the base is $NH_4OH$.

* * * * *